(12) United States Patent
Almlöf

(10) Patent No.: US 12,375,107 B2
(45) Date of Patent: Jul. 29, 2025

(54) DETECTING OR CORRECTING ONE OR MORE ERRORS IN DATA

(71) Applicant: Telefonaktiebolaget LM Ericsson (publ), Stockholm (SE)

(72) Inventor: Jonas Almlöf, Sollentuna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 213 days.

(21) Appl. No.: 18/249,811

(22) PCT Filed: Nov. 9, 2020

(86) PCT No.: PCT/SE2020/051079
§ 371 (c)(1),
(2) Date: Apr. 20, 2023

(87) PCT Pub. No.: WO2022/098271
PCT Pub. Date: May 12, 2022

(65) Prior Publication Data
US 2023/0403032 A1 Dec. 14, 2023

(51) Int. Cl.
*H03M 13/15* (2006.01)

(52) U.S. Cl.
CPC .................. *H03M 13/159* (2013.01)

(58) Field of Classification Search
CPC ...... H03M 13/159; H03M 13/05; H04B 10/70
See application file for complete search history.

(56) References Cited

U.S. PATENT DOCUMENTS

| | | | |
|---|---|---|---|
| 11,309,996 B2 * | 4/2022 | Babich | H04L 1/0059 |
| 2005/0237155 A1 * | 10/2005 | Hohberger | G06K 7/10039 |
| | | | 714/750 |
| 2015/0214978 A1 | 7/2015 | Yoon et al. | |

(Continued)

FOREIGN PATENT DOCUMENTS

WO 2019164591 A2 8/2019

OTHER PUBLICATIONS

Almlof, J.,et al., "A short and efficient error correcting code for polarization coded photonic qubits in a dissipative channel", Optics Communications 284,2011, pp. 550-554. (Year: 2011).*

(Continued)

*Primary Examiner* — Mark D Featherstone
*Assistant Examiner* — Rong Tang
(74) *Attorney, Agent, or Firm* — Murphy, Bilak & Homiller, PLLC

(57) ABSTRACT

Examples of this disclosure include a method of detecting or correcting one or more errors in data. The method comprises receiving data in a channel, wherein the data comprises one or more symbols, wherein each symbol corresponds to one of a ground state or to one of one or more energized states, and wherein the only transition possible for a symbol in the channel is one in which one of the one or more energized states transitions to the ground state, and wherein the data comprises at least one symbol that corresponds to the ground state. The method also comprises analyzing the one or more symbols to determine if a transition of one or more of the states has occurred and, if a transition of one or more of the states has occurred, detecting or correcting errors in the data.

20 Claims, 5 Drawing Sheets

(56) References Cited

U.S. PATENT DOCUMENTS

2022/0092462 A1* 3/2022 Huai .................... G06N 10/40
2022/0329417 A1* 10/2022 Farinholt ............. H04L 9/0858

OTHER PUBLICATIONS

Björk, G, et al., "Channel and carrier adapted quantum error correction," https://doi.org/10.48550/arXiv.0803.2641, Mar. 18, 2008, pp. 1-8.

Chang, Jin, et al., "Multimode-fiber-coupled superconducting nanowire single-photon detectors with high detection efficiency and time resolution," Applied Optics, vol. 58, No. 36, 2019, pp. 9803-9807.

Chuang, I, et al., "Codeword stabilized quantum codes: Algorithm and structure," Journal of Mathematical Physics, vol. 50, No. 4, 2009, pp. 1-12.

Ding, Y., et al., "On-demand single photons with high extraction efficiency and near-unity indistinguishability from a resonantly driven quantum dotin a micropillar," Phys. Rev. Lett., vol. 116, 2016, pp. 1-5.

Reed, I. S., Solomon, G., "Polynomial codes over certain finite fields," Journal of the Society for Industrial and Applied Mathematics, vol. 8, No. 2, Jun. 1960, pp. 300-304.

Testardi, L.R., "Destruction of superconductivity by laser light," Phys. Rev. B, vol. 4, No. 7, Oct. 1, 1971, pp. 2189-2196.

Zwiller, Valery, et al., "Quantum optics with single quantum dot devices," New J. Phys., vol. 6, No. 96, 2004, pp. 1-24.

Almlöf, J., et al., "A short and efficient error correcting code for polarization coded photonic qubits in a dissipative channel", Optics Communications 284, 2011, pp. 550-554.

* cited by examiner

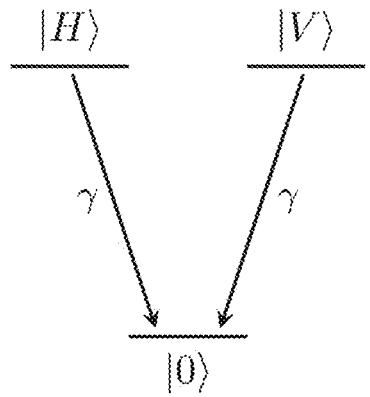

FIG. 1

```
┌─────────────────────────────────────────────────────────┐
│ Receiving data in a channel, wherein the data comprises │
│ one or more symbols, wherein each symbol corresponds to │
│ one of a ground state or to one of one or more          │
│ energized states, and wherein the only transition       │──202
│ possible for a symbol in the channel is one in which    │
│ one of the one or more energized states transitions to  │
│ the ground state, and wherein the data comprises at     │
│ least one symbol that corresponds to the ground state   │
└─────────────────────────────────────────────────────────┘
                            │
┌─────────────────────────────────────────────────────────┐
│   Analyzing the one or more symbols to determine if a   │──204
│   transition of one or more of the states has occurred  │
└─────────────────────────────────────────────────────────┘
                            │
┌─────────────────────────────────────────────────────────┐
│   If a transition of one or more of the states has      │
│   occurred, detecting or correcting one or more errors  │──206
│   in the data                                           │
└─────────────────────────────────────────────────────────┘
```

Forming data for transmission, wherein the data for transmission comprises one or more symbols, wherein each symbol corresponds to one of a ground state or to one of one or more energized states, and wherein the only transition possible for a symbol in the channel is one in which one of the one or more energized states transitions to the ground state, and wherein the data comprises at least one symbol that corresponds to the ground state — 302

| n \ code action | D∞ | D1 | D2 | D3 | D4 | C1 | C2 | C3 | C4 | C5 |
|---|---|---|---|---|---|---|---|---|---|---|
| 1 | 2 | 2 | 2 | 2 | 2 | — | — | — | — | — |
| 2 | 4 | 5 | 4 | 4 | 4 | 3 | — | — | — | — |
| 3 | 12 | 14 | 12 | 12 | 12 | 6 | 3 | — | — | — |
| 4 | 32 | 41 | 33 | 32 | 32 | 14 | 4 | 3 | — | — |
| 5 | 80 | 122 | 90 | 80 | 80 | ? | 9 | 3 | 3 | — |
| 6 | 240 | 365 | 252 | 241 | 240 | ? | ? | 8 | 3 | 3 |
| 7 | 672 | 1094 | 756 | 686 | 673 | ? | ? | ? | 5 | 3 |

FIG. 4

| n \ code action | C1D∞ | C2D∞ | C3D∞ | C4D∞ |
|---|---|---|---|---|
| 3 | 4 | 2 | — | — |
| 4 | 8 | 2 | 2 | — |
| 5 | 16 | 5 | 2 | 2 |
| 6 | ? | 12 | 4 | 2 |

FIG. 5

| code word | Lost photon | | | Syndrome state |
|---|---|---|---|---|
| | 1 | 2 | 3 | |
| $\|HHH\rangle$ | H | | | $\|0HH\rangle$ |
| | | H | | $\|H0H\rangle$ |
| | | | H | $\|HH0\rangle$ |
| $\|VVV\rangle$ | V | | | $\|0VV\rangle$ |
| | | V | | $\|V0V\rangle$ |
| | | | V | $\|VV0\rangle$ |
| $\|000\rangle$ | immune | | | $\|000\rangle$ |
| $\|H0V\rangle$ | H | | | $\|00V\rangle$ |
| | | | V | $\|H00\rangle$ |
| $\|0VH\rangle$ | | V | | $\|00H\rangle$ |
| | | | H | $\|0V0\rangle$ |
| $\|VH0\rangle$ | V | | | $\|0H0\rangle$ |
| | | H | | $\|V00\rangle$ |

FIG. 10

DETECTING OR CORRECTING ONE OR MORE ERRORS IN DATA

TECHNICAL FIELD

Examples of the present disclosure relate to a method of detecting or correcting one or more errors in data, an apparatus for detecting or correcting one or more errors in data, a method of forming data for transmission in a channel, and to an apparatus for forming data for transmission in a channel.

BACKGROUND

Error-correction codes for data are often used, for example for protecting music and data on compact discs (CDs), protecting information on storage and for protecting information when transmitted over a channel. Examples of such codes are Reed-Solomon codes and Turbo codes. The latter can be used in deep-space communication scenarios where the signal is weakened due to sending the information over large distances. These codes typically take a string of symbols, i.e., the message, in clear text and then add redundant symbols that may be used to recover the message if one or more of the symbols are lost or distorted. The receiver of the coded message that includes errors can either detect that the message includes errors or correct the errors depending on the type of code and the length of the block.

Information may also be sent using light in optical fibres, benefitting from the low loss due to total internal reflection in the fibre. In quantum optics, many applications utilise photons, i.e., the discrete manifestations of light, as a means for performing various experiments. Recently, reliable single photon emission has been achieved [2], [3] such that exactly one photon can be emitted on-demand. Also, detectors have been developed for detecting single photons with very high accuracy [4], [5].

SUMMARY

An aspect of the present disclosure provides a method of detecting or correcting one or more error in data. The method comprises receiving data in a channel, wherein the data comprises one or more symbols, wherein each symbol corresponds to one of a ground state or to one of one or more energized states, and wherein the only transition possible for a symbol in the channel is one in which one of the one or more energized states transitions to the ground state, and wherein the data comprises at least one symbol that corresponds to the ground state. The method also comprises analyzing the one or more symbols to determine if a transition of one or more of the states has occurred, and if a transition of one or more of the states has occurred, detecting or correcting one or more errors in the data.

Another aspect of the present disclosure provides a method of forming data for transmission in a channel. The method comprises forming data for transmission, wherein the data for transmission comprises one or more symbols, wherein each symbol corresponds to one of a ground state or to one of one or more energized states, and wherein the only transition possible for a symbol in the channel is one in which one of the one or more energized states transitions to the ground state, and wherein the data comprises at least one symbol that corresponds to the ground state.

A further aspect of the present disclosure provides apparatus for detecting or correcting one or more errors in data. The apparatus comprises a processor and a memory. The memory contains instructions executable by the processor such that the apparatus is operable to receive data in a channel, wherein the data comprises one or more symbols, wherein each symbol corresponds to one of a ground state or to one of one or more energized states, and wherein the only transition possible for a symbol in the channel is one in which one of the one or more energized states transitions to the ground state, and wherein the data comprises at least one symbol that corresponds to the ground state, analyze the one or more symbols to determine if a transition of one or more of the states has occurred, and if a transition of one or more of the states has occurred, detect or correct one or more errors in the data.

A still further aspect of the present disclosure provides apparatus for forming data for transmission in a channel. The apparatus comprises a processor and a memory. The memory contains instructions executable by the processor such that the apparatus is operable to form data for transmission, wherein the data for transmission comprises one or more symbols, wherein each symbol corresponds to one of a ground state or to one of one or more energized states, and wherein the only transition possible for a symbol in the channel is one in which one of the one or more energized states transitions to the ground state, and wherein the data comprises at least one symbol that corresponds to the ground state.

An additional aspect of the present disclosure provides apparatus for detecting or correcting one or more errors in data. The apparatus is configured to receive data in a channel, wherein the data comprises one or more symbols, wherein each symbol corresponds to one of a ground state or to one of one or more energized states, and wherein the only transition possible for a symbol in the channel is one in which one of the one or more energized states transitions to the ground state, and wherein the data comprises at least one symbol that corresponds to the ground state, analyze the one or more symbols to determine if a transition of one or more of the states has occurred, and if a transition of one or more of the states has occurred, detect or correct one or more errors in the data.

Another aspect of the present disclosure provides apparatus for forming data for transmission in a channel. The apparatus is configured to form data for transmission, wherein the data for transmission comprises one or more symbols, wherein each symbol corresponds to one of a ground state or to one of one or more energized states, and wherein the only transition possible for a symbol in the channel is one in which one of the one or more energized states transitions to the ground state, and wherein the data comprises at least one symbol that corresponds to the ground state.

BRIEF DESCRIPTION OF THE DRAWINGS

For a better understanding of examples of the present disclosure, and to show more clearly how the examples may be carried into effect, reference will now be made, by way of example only, to the following drawings in which:

FIG. 1 illustrates an example of orthogonal single-photon states dissipating in a channel;

FIG. 2 is a flow chart of an example of a method of detecting or correcting one or more errors in data;

FIG. 3 is a flow chart of an example of a method of forming data for transmission in a channel;

FIG. 4 is a table illustrating the performance of example error detecting and correcting codes according to examples of this disclosure.

FIG. 5 is a table illustrating the performance of further example error detecting and correcting codes according to examples of this disclosure;

FIG. 10 shows an example of valid code words for example error detecting and/or correcting codes according to embodiments of this disclosure.

DETAILED DESCRIPTION

Figures 6, 7:
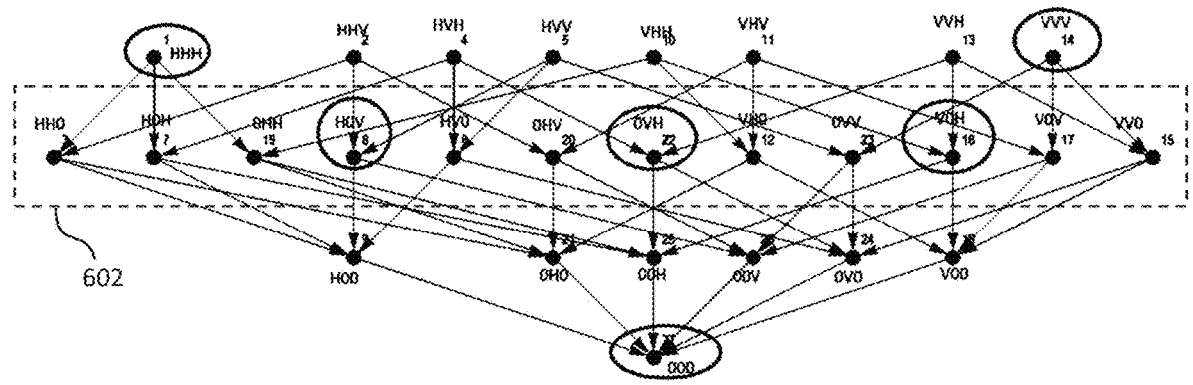
FIG. 6 is a table illustrating valid code words and syndrome words for an error correcting code according to an example of this disclosure.
FIG. 7 is a table illustrating valid code words and syndrome words for the example of FIG. 6.

The following sets forth specific details, such as particular embodiments or examples for purposes of explanation and not limitation. It will be appreciated by one skilled in the art that other examples may be employed apart from these specific details. In some instances, detailed descriptions of well-known methods, nodes, interfaces, circuits, and devices are omitted so as not obscure the description with unnecessary detail. Those skilled in the art will appreciate that the functions described may be implemented in one or more nodes using hardware circuitry (e.g., analog and/or discrete logic gates interconnected to perform a specialized function, ASICs, PLAs, etc.) and/or using software programs and data in conjunction with one or more digital microprocessors or general purpose computers. Nodes that communicate using the air interface also have suitable radio communications circuitry. Moreover, where appropriate the technology can additionally be considered to be embodied entirely within any form of computer-readable memory, such as solid-state memory, magnetic disk, or optical disk containing an appropriate set of computer instructions that would cause a processor to carry out the techniques described herein.

Hardware implementation may include or encompass, without limitation, digital signal processor (DSP) hardware, a reduced instruction set processor, hardware (e.g., digital or analogue) circuitry including but not limited to application specific integrated circuit(s) (ASIC) and/or field programmable gate array(s) (FPGA(s)), and (where appropriate) state machines capable of performing such functions.

Sending light in optical fibres, and over a channel such as free space (otherwise referred to as wireless transmission or communication), currently relies on simply amplifying the number of photons in each transmitted pulse until the receiver can receive the sent message, despite losses in the channel. This brute-force method may use in the order of $10^5$-$10^8$ photons per bit, depending on the fibre, data rate, distance, channel losses and other factors. Even though each photon carries very little energy, sending a large number of photons may be costly. Attempts to remedy this problem may include beam forming to avoid sending energy in the wrong direction and using larger parts of the spectrum. The latter may also require consideration to public health since light of certain frequency ranges can be harmful to biological life, and the available transmission frequencies are getting scarcer as the applications grow in number. In space applications, sending light in free space may cause the transmitted signal and thus the reception efficiency to follow the inverse square law, thus posing other problems, for example for satellites with limited power sources. Sending a larger-than-necessary number of redundant signal-carrying photons not only causes wasted energy, but may also cause interference with other communications.

In addition, current error-correction codes do not take advantage of the fact that the vacuum state can also be utilised as a symbol, and thus a symbol can include a time or frequency period where little or no energy is transmitted, referred to in some examples as a no-photon state, erasure state or erasure symbol.

Embodiments of this disclosure may for example avoid using excessive energy in communication by using single photons for symbols, using error-correcting codes that are adapted for these information carriers. Additionally or alternatively, embodiments of this disclosure may also, by avoiding using excessive signal energy, solve the problems of excessive signal energy and/or interference when parties communicate. Embodiments of this disclosure may also increase the range of a transmitted signal, for example when transmitted in free space (or vacuum or near-vacuum).

Single-photon codes have been suggested for protecting a general quantum state, using so-called quantum error correction [1], but in this disclosure it will be shown that also codes protecting classical information can benefit from the use of single-photons. In particular examples, two orthogonal modes of single photons are well-suited for error correction since they have a common final state after being subject to absorption or dissipation. This final state (e.g. referred to as a no-photon state) may be immune to further dissipation in some examples.

Error detection/correction codes presented herein are becoming increasingly practical since the generation of single-photons on-demand is developing at a rapid pace, see e.g., [2], [3], allowing for improvement in many applications that had previously been performed using filtering. Such a filtered photon source has the drawback that the states exhibit a Gaussian distribution, i.e., where the vacuum state |0⟩ is the most common state. A single-photon source, on the other hand, may for example deliver one photon each time it is requested with high reliability.

In a parallel development, detection efficiency for single photons has also improved, for example using the effect that superconductivity is lost in a low-temperature array of nanowires, [4], an effect that is taken advantage of in recent detectors, see e.g. [5].

In this disclosure, the possibility of using single-photons as carriers or symbols for transfer of information is provided in some examples. Some examples provide codes of both the error-correcting and error-detecting kind, which may not follow the simple algebra that is associated with binary communication channels. Codes presented herein may for example have, like codes for an erasure channel, e.g. Reed-Solomon codes [6], a common state which indicates that an error occurred. However, examples of this disclosure may incorporate an "erased" symbol (e.g. erasure symbol or no-photon state) in the encoding, and thus will achieve higher rate and lower energy demands than previous codes for the erasure channel.

In some examples of this disclosure, two orthogonal single-photon states |H⟩ and |V⟩ are used, alluding to a single photon in a well-defined spatio-temporal mode, linearly polarized either in the horizontal or in the vertical direction respectively. However, the proposal is valid for any two basis states (e.g. orthogonal states) provided each basis state contains a single photon (or any other single excitation or symbol dissipating to a common ground state). For these states, in some examples, dissipation will imply that both states undergo a quantum jump to the ground state |0⟩ due to absorption, scattering or other loss. That is, with probability γ, the jump $|H\rangle \to |0\rangle$ or $|V\rangle \to |0\rangle$ will occur, given that the qubit was initially in either the $|H\rangle$ or $|V\rangle$ state. FIG. 1 illustrates an example of orthogonal single-photon states dissipating in a channel such as free space for example. In the example shown, the states $|H\rangle$ and $|V\rangle$ both have the same energy, and with a probability γ, the state will undergo a transition to the common state $|0\rangle$. The state $|0\rangle$ is unaffected by noise and will not dissipate further in this example.

In some examples, when dissipation is included, the Hilbert space associated with the physical qubit state is three-dimensional. In some examples, the jump process under these assumptions is symmetric with regards to the states $|H\rangle$ and $|V\rangle$, but is asymmetric with regards to the vacuum state $|0\rangle$. In other words, under these conditions the state $|0\rangle$ is unaffected by the channel errors and will remain stable regardless of γ.

In some examples, it is also assumed that the channel errors do not interchange the states $|H\rangle$ and $|V\rangle$, an assumption that may be valid for example for free-space communication, but also fiber-optic communication, once polarization errors are stabilized in some examples by other means. For example, in a channel such as an optical fibre or free space, "polarization drift" may be present. In an example, the polarization drift may be small, such as in the order of 1 degree on the Bloch sphere in one hour. The probability of a slightly disturbed $|H'\rangle \approx |H\rangle$ being measured as a $|V\rangle$ state, i.e., an $|H\rangle \to |V\rangle$ error, is:

$$|\langle H'|V\rangle|^2 = 1 - |\langle H'|H\rangle|^2$$

Thus, the probability for this type of error (if no polarization correction was performed for a full hour) may for example be of the order of 0.0001 (for one degree drift). However, even such small drifts can accumulate in some examples, so examples of this disclosure may include means for correcting for polarization drift.

In some examples, the polarization drift or decoherence is a slow process, and may also be dependent (weakly) on wavelength of the photons. Thus, in some examples, polarization drift may be compensated for by using a probe or training signal, e.g. a probe signal with a wavelength shifted a few tenths of a nm from the single photons' wavelength. This probe signal may be separated from the information carrying signal for example using a dichroic mirror, and the information carrying signal may then be filtered using one or more narrow-band filters to completely remove the probe photons. The probe signal, in turn, can be split into three parts which will be used to measure the three Stokes components, from which the polarization direction on the Poincare sphere can be extracted. The deviation from the expected polarization can now be corrected, for example using a feedback loop active on all frequencies, i.e., both the probe and the information carrying signal.

Many error detecting or correcting codes are built with the intent of protecting transmitted information from the symmetric bit-flip channel, i.e., the case when the symbol 0 is changed to a 1, or vice versa, with equal probabilities. Such codes separate information to be transmitted into blocks, and are denoted $[n, k, d]_b$, where n indicates how many symbols are used in each block, $b^k$ indicates how many logical code words are encoded in the block and b denotes the size of the alphabet of the symbols. If omitted, typically b=2. If b=2, then k indicates the number of logical bits encoded in the block. Finally, d indicates the code distance, i.e. the minimum number of errors needed to translate at least one of the code words into another. The parameter d can be used to describe both error-detecting and error-correcting codes in this channel, and the number of errors that can be corrected equals (d−1)/2, while the number of errors that only can be detected equals d−1, thus the notation [n, k, d] could refer to either of the two types. A simple example of this is the simplest error correcting code for this channel, a [3, 1, 3] code. Since it has distance 3 it can correct one error using the code words 000 and 111, however three bits could also be used for detecting 1 error using the code words {000, 011, 101, 110}, thus resulting in a [3, 2, 2] code. Three bit symbols could also be used to detect two errors using the code words {000, 111}, denoted [3, 1, 3].

For example codes described herein, the notation "C1" for a code that can correct one error, "D2" for a code that can detect two errors and "C1 D1" for a code that can correct 1 error and detect one additional error. "C2" is used for a code that can correct two errors, "D2" is used for a code that can detect two errors and so on. The optimal number of code words for some example codes may not always be of the form $2^k$, but is denoted K herein.

In some examples, a code can detect infinitely many errors—a D∞ code—is provided, emanating from the channel characteristics. The simplest example of this can be seen from a single photon per symbol code with the code words $\{|H\rangle, |V\rangle\}$, representing a horizontally and vertically polarized photon respectively, since there are no channel errors that can take the $|H\rangle$ state to a $|V\rangle$ state. A $|0\rangle$ state (e.g. a no-photon state in a time bin) will indicate that an error occurred, but not what the original code word (symbol in this example) was. This asymmetry provides an opportunity to construct code words that avoid misinterpretation due to errors.

A sequence of time-bin coded single-photon states are in this disclosure interpreted as a product state, since time bins are assumed to lack quantum correlation with each other, i.e., words are formed of the form $|H\rangle \otimes |H\rangle$ and will be denoted $|HH\rangle$ for short, where H could instead be V or 0.

The Hamming bound states that for non-degenerate error-correction codes the number of words in a code space of an $[n, \log_2 K, (2t-1)/2]_b$ code is upper bounded by the total number of possible words, i.e.:

$$K \sum_{i=0}^{t} \binom{n}{i}(b-1)^i \leq b^n \tag{1}$$

where K is the number of code words, t is the number of errors that the code can correct, assuming a b-symbol alphabet and if all symbol transitions were possible.

If there are three symbols in the alphabet (e.g. two orthogonally polarised photon states and a no-photon state), the Hamming bound would thus read $$K \sum_{i=0}^{t} \binom{n}{i}(3-1)^i \leq 3^n \tag{2}$$

where, again, t indicates the number of errors that can be corrected.

In examples of this disclosure, a 1-error correcting code (C1) is presented with 6 code words, as described below. Such a code appears to violate equation (2) above, since the right hand side equates to 27, whereas the left hand side is 42. The reason for this is that the dissipative channel forbids some errors, such as the possibility of an error that takes a $|0\rangle$ state to a $|H\rangle$ or a $|V\rangle$ state, or an error that takes a $|H\rangle$ state to a $|V\rangle$ state or vice versa.

An example process of communication starts with an agreement on how to measure the information-carrying photons, i.e. what measurement basis should be used. The sender may transmit a long series of identical states prepared by the sender and agreed by the receiver, e.g., $|H\rangle$. The receiver may know when this initial series is transmitted, and may adjust a polarizer in front of a detector in order to find the right basis. When all photons result in positive detections in the detector for |H⟩, the polariser can now distinguish between "H" and "V" polarised photons. Alternatively, the communicating parties could use a distant star as an agreed direction for the polarizer.

After the calibration of the basis to use, for example as described in the above paragraph or using another method, the sender prepares a message and encodes it using an error correcting and/or error detecting code as described herein. In particular examples, a source of single photons may emit one photon in each of a plurality of time bins. The scheme may for example assume that each photon is in a well-defined polarization state which we can take to be |H⟩, without loss of generality, or the "no-photon" state |0⟩. If the |V⟩ state is to be transmitted, the |H⟩ state may pass through a half-wave plate. The polarization basis is assumed to be communicated to, derivable by or known by the sender. A message or data to be transmitted is then encoded using the code words for the code being used. After encoding, each code block will have the property that x errors can be corrected and y additional errors can be detected, and thus the code's code action is CxDy. As each code block is sent through the channel, errors may affect the three quantum states according to the example shown in FIG. 1. As the encoded and noisy message arrives at the receiver, in some examples, all photons are separated using e.g. a birefringent crystal or polarising beam splitter, separating the |H⟩ and the |V⟩ states into two beams. These beams may then be sent to respective photon detectors that will each either detect or not detect a photon, for example in each time bin, thus providing from each detector a stream of bits that can be used to determine the polarization state of a received photon (or an indication that no photon was received) in each time bin.

FIG. 2 is a flow chart of an example of a method 200 of detecting or correcting one or more error in data (e.g. received data, such as a received message). The method comprises, in step 202, receiving data in a channel, wherein the data comprises one or more symbols, wherein each symbol corresponds to one of a ground state (e.g. a no-photon state or |0⟩) or to one of one or more energized states, such as for example a plurality of states with non-equal polarization states (e.g. |H⟩ and |V⟩). The symbols may each comprise a single photon (or no photon) in some examples. The only transition possible for a symbol in the channel is one in which one of the one or more energized states transitions to the ground state, for example as illustrated in FIG. 1, and wherein the data comprises at least one symbol that corresponds to the ground state. Thus for example the error detecting or correcting code used may use the fact that the ground state cannot transition to an energized state to provide improved error detection and/or correction capability when compared to conventional codes such as those that assume (possibly due to the nature of the channel, the symbols used and/or the communication apparatus) that a transition between energized states (e.g. 0 to 1 or vice versa) is possible. At least part of the channel may comprise for example free space and/or an optical fibre. In some examples, the ground state and the one or more energized states correspond to orthogonal basis states of a corresponding Hilbert space.

Step 204 of the method 200 comprises analyzing the one or more symbols to determine if a transition of one or more of the states has occurred, for example by determining whether the received symbol (or group of symbols corresponding to the size of a code word) matches a code word or symbol of the code used to encode the data. Step 206 of the method 200 comprises, if a transition of one or more of the states has occurred, detecting or correcting one or more errors in the data.

In some examples, the probabilities of each one of the one or more energized states transitioning to the ground state in the channel are substantially equal. Thus for example the transitions shown in FIG. 1 are possible in the channel. The probabilities each one of the one or more energized states transitioning to the ground state in the channel may additionally or alternatively in some examples be related to the time or length over which the data has been transmitted in the channel.

In some examples, the step of detecting or correcting one or more errors in a message in step 206 of the method 200 comprises determining if the one or more symbols correspond to a syndrome word, wherein the syndrome word is associated with a valid code word. A syndrome word may in some examples be a word that can be obtained by making up to a certain number of changes to an associated valid code word and not any other code word, where the certain number is equal to the number of correctable errors. If the one or more symbols correspond to a syndrome word, the syndrome word may be corrected to the valid code word. Hence, the method 200 includes error correction in such examples.

one or more In some examples, the step of detecting or correcting one or more errors in a message in step 206 comprises determining if the one or more symbols do not correspond to one of a plurality of valid code words, or one of a plurality of respective syndrome words (if any) associated with each of the valid code words. If the one or more symbols do not correspond to one of the valid code words or syndrome words, it may be determined that the data contains at least one error. Hence, the method 200 includes error detection in such examples.

Detecting or correcting one or more errors in the data in step 206 may in some examples comprise attempting to correct the error in the data, and if attempting to correct the error in the data is unsuccessful, discarding the data (e.g. discarding a whole data block) and/or requesting a sender of the data to re-send the data (e.g. re-send a whole data block).

In some examples of this disclosure, each symbol may be a single photon or no-photon state, or may be multiple photons (e.g. of the same or different polarizations), one or more photons mixed with one or more no-photon states, or multiple no-photon states.

FIG. 3 is a flow chart of an example of a method 300 of forming data for transmission in a channel. In some examples, the method 300 may be performed by a sender or transmitter of data while the method 200 of FIG. 2 may be performed by the receiver of that data. The method 300 comprises, in step 302, forming data for transmission, wherein the data for transmission comprises one or more symbols, e.g. single photons or no-photon state in some examples. Each symbol corresponds to one of a ground state (e.g. |0⟩) or to one of one or more energized states, such as for example a plurality of states with non-equal polarization states (e.g. |H⟩ and |V⟩). The only transition possible for a symbol in the channel is one in which one of the one or more energized states transitions to the ground state, and wherein the data comprises at least one symbol that corresponds to the ground state.

Thus for example the error detecting or correcting code used in the method 300 may use the fact that the ground state cannot transition to an energized state to provide improved error detection and/or correction capability when compared to conventional codes such as those that assume (possibly due to the nature of the channel, the symbols used and/or the communication apparatus) that a transition between energized states (e.g. 0 to 1 or vice versa) is possible. At least part of the channel may comprise for example free space and/or an optical fibre. In some examples, the ground state and the one or more energized states correspond to orthogonal basis states of a corresponding Hilbert space.

FIG. 4 is a table illustrating the performance of example error detecting and correcting codes according to examples of this disclosure. FIG. 5 is a table illustrating the performance of further example error detecting and correcting codes according to examples of this disclosure, where each code includes both error detection and error correction capability. In both FIGS. 4 and 5, for various values of n (the number of symbols in each code word or block) and codes of different error detection and/or correction capability, the parameter K (e.g. the maximum number of valid code words to provide the indicated error detection/correction capability) is listed for K>1 and calculated using the "maximum independent set algorithm" for directed graphs.

A particular example will now be described in more detail, where a code is selected from the table shown in FIG. 4 where n=3 and K=6 code words (i.e. a "C1" code that may correct one error). FIG. 6 illustrates valid code words and syndrome code words for this example error correcting code. For example, HHH represents a code word with three symbols corresponding to |H⟩ states, H0V resnts a code word with three symbols corresponding to the states |H⟩, |0⟩ and |V⟩ respectively, and so on. Each of the six valid code words, highlighted with circles around them, can suffer dissipation errors in each of their excited modes. The possible outcomes and resulting states after one symbol dissipates to |0⟩ (which are the only permitted transitions in this example) are indicated with arrows. No two code words share any syndrome-states, so that each syndrome-state (or syndrome word) uniquely identifies a single valid code word. Thus each syndrome state is associated with one valid code word. The syndrome states for each valid code word are also shown in the Table of FIG. 7.

In another particular example, FIG. 4 identifies a D1 code (that can detect a single error) where n=3 and there are K=12 valid code words. The code words may comprise for example the code words shown in the second layer 602 of FIG. 6. The explicit code words are the states in the second "layer", i.e., all the states with two excitations and one no-photon state (e.g. HH0, H0H, 0HH, H0V and so on). All the states with fewer total excitations than two can be used to identify that an error has occurred, and since the |000⟩ state is immune to dissipation, the signal that an error occurred can travel indefinitely in a dissipative channel.

In some examples, the number N of possible code words in a block code of length n symbols, where each symbol can be a "no photon" symbol or one of two possible energized states (e.g. H or V state), thus with each code word having energy (n−t)hv, is given by:

$$N(n,t) = \binom{n}{t} 2^{(n-t)} \quad (3)$$

where h is Planck's constant and v is the frequency of the photon(s).

The number N represents the highest number of valid code words for particular values of n and t. Thus, for example, a code word of length n=5 where t=4 (e.g. one symbol of H or V and four no-photon symbols or states) may be one of N=10 different code words, according to equation (3) above. However, for a particular code, there may be more valid code words that satisfy a particular requirement of the code (for example, the requirement to be able to detect one dissipation error, such as a D1 code). In a particular example, a code word may have 5 symbols (n=5). For a D1 code, for example, valid code words may include those with one photon symbol (e.g. H or V) and four "empty" or "no photon" symbols—i.e. code words where t=4. Thus there may be N=10 valid code words according to equation (3) above. However, for a D1 code, code words where t=2 (i.e. three H or V symbols and two no photon states) are valid code words, providing an additional N=80 code words. This is because one dissipation error in a code word would provide a code word having two energized symbols and three no-photon symbols, which is not a valid code word. Similarly, code words where t=0 are valid code words, providing an additional 32 valid code words according to (3).

In general, the maximum number of valid code words for a code of length n is the maximum sum of all values of N for various values of t where the code words meet the requirements of the code. Thus, for example, the maximum number of valid code words for a D1 code of length n=5 is 10+80+32=122 valid code words, representing the sum of values of N for t=0, 2 or 4. Values for the maximum number of valid code words can be determined for other codes in a similar manner. For example, where n=5, a D2 code may have up to 80+10=90 valid code words (e.g. for t=1 and t=4), and for a D∞ code is 80 code words (for t=2, or alternatively t=1). In the latter example, only one value for t is used, because otherwise one or more dissipation errors for a code word may result in another valid code word.

A code that uses the highest number of valid code words may also maximise its corresponding source entropy, and therefore its rate of transmission in the noiseless case. For example, N has its maximum for some value of t, given a fixed code word length n, and this maximum will be the largest N for a photon code that can detect an unlimited number of errors in each code word. For example, for n=4 the D∞ code with the highest number of has N=32, which corresponds to all possible states having t=1, but for n=7 the maximum number of code words is 672, which occurs for t=2. Using all the states in the energy manifold (n −t) that has the highest value of N from (3) may for example provide an optimal D∞ code, since in that case one must choose code words exclusively from the same energy manifold to avoid collision between the code words and their syndrome words.

Error correction codes in some examples, on the other hand, may require that syndrome words for different code words do not intersect. Finding code words with this property can be done using, e.g., the maximum independent set algorithm, but adopted for a graph that is directed as opposed to the common case where state transitions are symmetric and the graph is therefore undirected. A systematic construction, however, exists for the trivial case of a code with n photons that can correct n −1 errors and 3 code words, and the code words are simply {|0 . . . 0⟩, |H . . . H⟩, |V . . . V⟩)}, i.e., a repetition code assembled as a product state using the constituents {|0⟩, |H⟩, |V⟩}. A C(n −1)D∞ code may be obtained by removing the |0 . . . 0⟩ code word from this example, i.e. the code has two valid code words instead of three, but can detect all additional errors after correcting the n−1 error(s) first. This is because the |0 . . . 0⟩ state with no excitations cannot further dissipate.

As an example of how single-photon codes could be used, consider long-distance communication performed using a single mode fibre, usually at the wavelength 1550 nm and a code block with 50 symbols/photons. The comparison includes two techniques, first using an n=50, C49D∞ code mentioned in the example above with two code words {|H . . . H⟩, |V . . . V⟩}. The error correction fails when all photons in a block are lost (e.g. are dissipated), and in such an event the block is marked as erroneous and can be either discarded or the sender could be asked to re-send the block (which may in some examples be at the cost of additional use of the channel). This example can be compared to a "pulse" method where each pulse has 50 photons with unknown polarization, and two symbols are used, "1" is represented by a pulse of photons in a certain time slot, whereas "0" is represented as the lack of any photons in a time slot. Photons may be lost in the transmission channel, e.g. an optical fibre, but this would only affect the "1" symbol whereas the "0" state will be unaffected. When all photons in a given pulse are lost, the receiver will erroneously interpret a sent "1" as a "0" (without the possibility to detect an error).

In some examples, to increase the length of the transmission channel (e.g. optical fibre) by around 15 km, the code block length may need to double and hence the energy per sent logical bit may also double. Therefore, in some examples, the signal may be re-created at regular intervals, i.e. de-coded, re-encoded and then re-transmitted. Amplification may be avoided in some examples as because it may also amplify any noise, and since examples of codes described herein assume that the 10) state is stable, the performance of some example codes may decrease.

Figure 8:
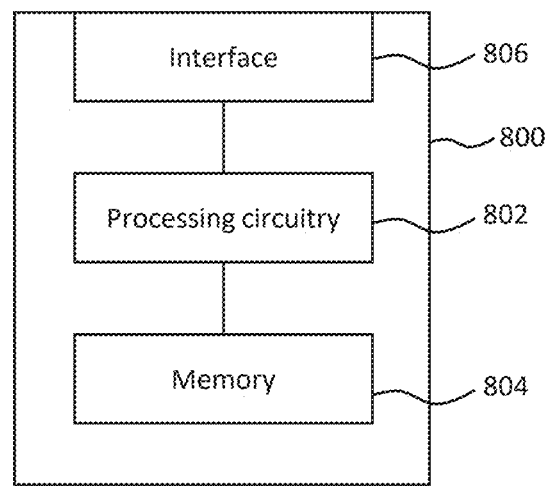
FIG. 8 is a schematic of an example of apparatus for detecting or correcting one or more errors in data.

FIG. 8 is a schematic of an example of an apparatus 800 for detecting or correcting one or more errors in data. The apparatus 800 comprises processing circuitry 802 (e.g. one or more processors) and a memory 804 in communication with the processing circuitry 802. The memory 804 contains instructions executable by the processing circuitry 802. The apparatus 800 also comprises an interface 806 in communication with the processing circuitry 802. Although the interface 806, processing circuitry 802 and memory 804 are shown connected in series, these may alternatively be interconnected in any other way, for example via a bus.

In one embodiment, the memory 804 contains instructions executable by the processing circuitry 802 such that the apparatus 800 is operable to receive data in a channel, wherein the data comprises one or more symbols, wherein each symbol corresponds to one of a ground state or to one of one or more energized states, and wherein the only transition possible for a symbol in the channel is one in which one of the one or more energized states transitions to the ground state, and wherein the data comprises at least one symbol that corresponds to the ground state; analyze the one or more symbols to determine if a transition of one or more of the states has occurred; and if a transition of one or more of the states has occurred, detect or correct one or more errors in the data. In some examples, the apparatus 800 is operable to carry out the method 200 described above with reference to FIG. 2.

Figure 9:
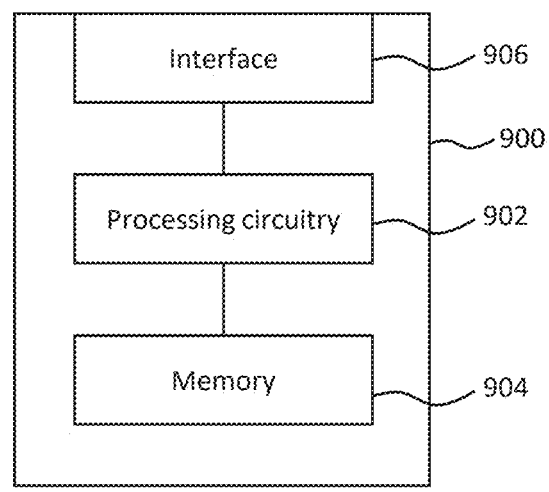
FIG. 9 is a schematic of an example of apparatus for of forming data for transmission in a channel.

FIG. 9 is a schematic of an example of an apparatus 900 for forming data for transmission in a channel. The apparatus 900 comprises processing circuitry 902 (e.g. one or more processors) and a memory 904 in communication with the processing circuitry 902. The memory 904 contains instructions executable by the processing circuitry 902. The apparatus 900 also comprises an interface 906 in communication with the processing circuitry 902. Although the interface 906, processing circuitry 902 and memory 904 are shown connected in series, these may alternatively be interconnected in any other way, for example via a bus.

In one embodiment, the memory 904 contains instructions executable by the processing circuitry 902 such that the apparatus 900 is operable to form data for transmission, wherein the data for transmission comprises one or more symbols, wherein each symbol corresponds to one of a ground state or to one of one or more energized states, and wherein the only transition possible for a symbol in the channel is one in which one of the one or more energized states transitions to the ground state, and wherein the data comprises at least one symbol that corresponds to the ground state. In some examples, the apparatus 900 is operable to carry out the method 300 described above with reference to FIG. 3.

Figure 10:
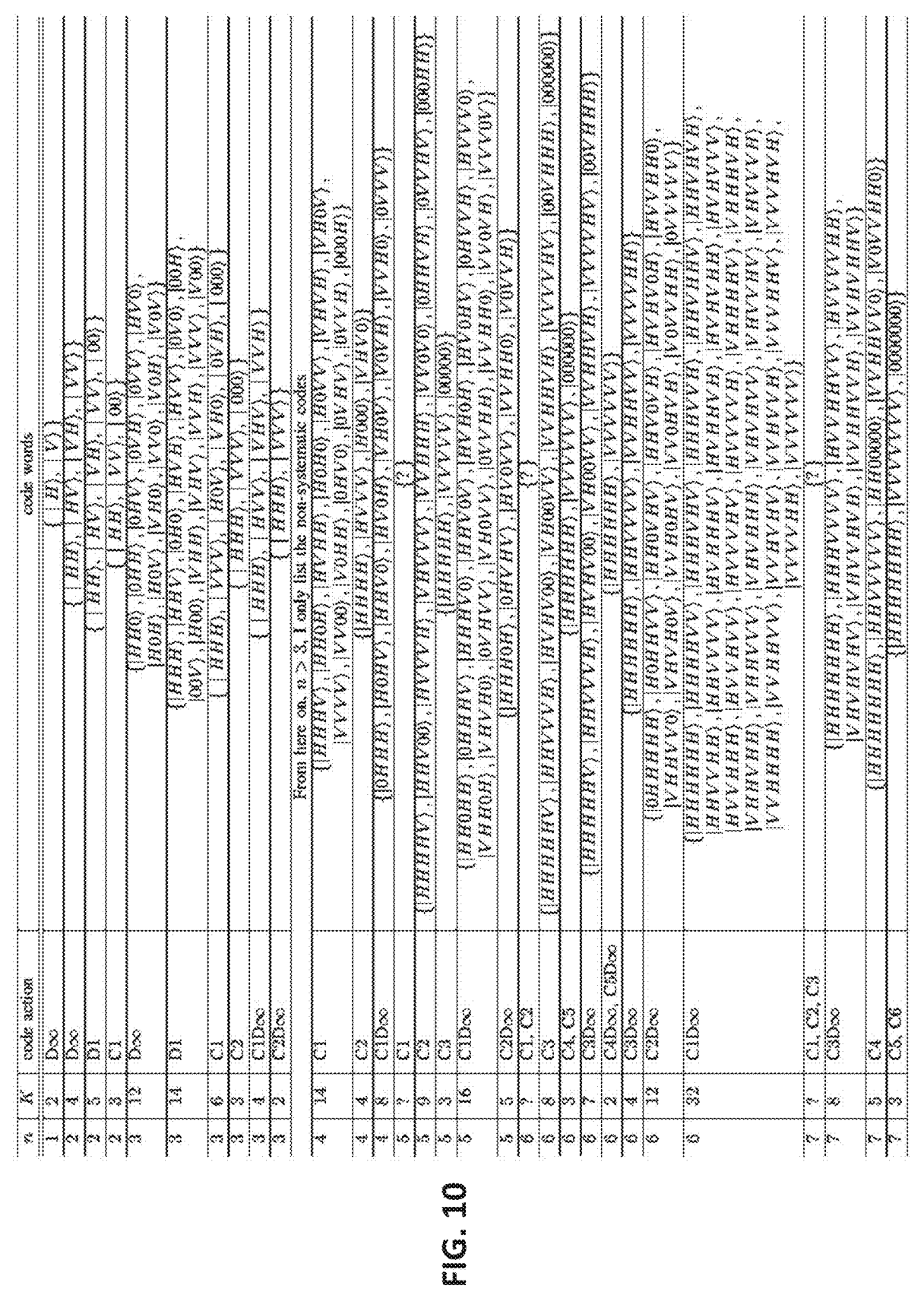

FIG. 10 shows an example of valid code words for example error detecting and/or correcting codes according to embodiments of this disclosure. Various codes are shown, for various values of n and K, and the code action is also shown for each code, where for example D1 indicates that the code can detect one error, and C2D∞ indicates that the code can correct two errors and detect an additional unlimited number of errors. For values of n of 4 and above, only non-systematic codes are shown.

It should be noted that the above-mentioned examples illustrate rather than limit the invention, and that those skilled in the art will be able to design many alternative examples without departing from the scope of the appended statements. The word "comprising" does not exclude the presence of elements or steps other than those listed in a claim or embodiment, "a" or "an" does not exclude a plurality, and a single processor or other unit may fulfil the functions of several units recited in the statements below. Where the terms, "first", "second" etc are used they are to be understood merely as labels for the convenient identification of a particular feature. In particular, they are not to be interpreted as describing the first or the second feature of a plurality of such features (i.e. the first or second of such features to occur in time or space) unless explicitly stated otherwise. Steps in the methods disclosed herein may be carried out in any order unless expressly otherwise stated. Any reference signs in the statements shall not be construed so as to limit their scope.

The invention claimed is:

1. A method for a receiver apparatus to detect or correct one or more errors in received data, the method comprising:
   receiving data via a channel, wherein:
      the data comprises a plurality of symbols formed into respective codewords having a same length of n symbols, where n>2;
      each symbol corresponds to one of the following states: a ground state associated with a single photon, and one or more energized states associated with the single photon;
      at least one of the symbols corresponds to the ground state; and
      the only possible transitions in the channel are the one or more energized states transitioning to the ground state; and
   analyzing the plurality of symbols to determine whether a transition of any of the corresponding states has occurred; and
   when it is determined that a transition of one or more of the states has occurred, detecting or correcting one or more errors in the data based on an error correction code having N>n valid codewords, wherein the N valid codewords include n length-n codewords with one symbol corresponding to the ground state and n−1 other symbols corresponding to any of the energized states.

2. The method of claim 1, wherein the ground state and the one or more energized states correspond to orthogonal basis states of a Hilbert space.

3. The method of claim 1, wherein respective probabilities of the one or more energized states transitioning to the ground state in the channel are one of the following: equal, or related to the time or length over which the data has been transmitted in the channel.

4. The method of claim 1, wherein one or more of the following applies: the ground state is unaffected by the channel, and the transitions result from noise in the channel.

5. The method of claim 1, wherein detecting or correcting one or more errors in the data comprises:
determining whether the one or more symbols correspond to a syndrome word that is associated with a valid code word; and
when it is determined that the one or more symbols correspond to the syndrome word, correcting the syndrome word to the valid code word.

6. The method of claim 1, wherein detecting or correcting one or more errors in the data comprises:
determining whether the one or more symbols correspond to any of a plurality of valid code words or to any of a respective plurality of syndrome words associated with the plurality of valid code words; and
based on determining that the one or more symbols do not correspond to any of the valid code words or any of the syndrome words, determining that the data contains at least one error.

7. The method of claim 1, wherein:
the ground state corresponds to a no-photon state; and
the one or more energized states comprise a single energized state that corresponds to a single photon state.

8. The method of claim 1, wherein:
the one or more energized states comprise a first polarized state and a second polarized state different than the first polarized state; and
one or more of the following applies:
the first polarized state and the second polarized state are linearly polarized; and
the first polarized state is orthogonal to the second polarized state.

9. The method of claim 1, wherein at least part of the channel comprises one of the following: an optical fiber, or free space.

10. The method of claim 1, wherein one or more of the following applies:
the error correction code is capable of correcting for one photon loss per codeword; and
n=3 and N=6.

11. The method of claim 1, wherein the N valid codewords also include at least one of the following:
one or more first length-n codewords with n symbols corresponding to a same energized state; and
a second length-n codewords with n symbols corresponding to the ground state.

12. A method of transmitting data in a channel, the method comprising:
forming data for transmission, wherein:
the data comprises a plurality of symbols formed into respective codewords having a same length of n symbols, where n>2;
each symbol corresponds to one of the following states: a ground state associated with a single photon, and one or more energized states associated with the single photon;
at least one of the symbols corresponds to the ground state; and
the only possible transitions in the channel are the one or more energized states transitioning to the ground state;
the codewords are selected from N>n valid codewords of an error correction code, wherein the N valid codewords include n length-n codewords with one symbol corresponding to the ground state and n−1 other symbols corresponding to any of the energized states; and
transmitting the formed data in the channel, wherein the respective symbols are transmitted using respective single photons as carriers.

13. The method of claim 12, wherein the ground state and the one or more energized states correspond to orthogonal basis states of a corresponding Hilbert space.

14. The method of claim 12, wherein respective probabilities of the one or more energized states transitioning to the ground state in the channel are one of the following: equal, or related to the time or length over which the data has been transmitted in the channel.

15. The method of claim 12, wherein:
the ground state corresponds to a no-photon state; and
the one or more energized states comprise a single energized state that corresponds to a single photon state.

16. The method of claim 12, wherein:
the one or more energized states comprise a first polarized state and a second polarized state different than the first polarized state; and
one or more of the following applies:
the first polarized state and the second polarized state are linearly polarized; and
the first polarized state is orthogonal to the second polarized state.

17. A transmitter apparatus configured to transmit data in a channel, the transmitter apparatus comprising:
a processor; and
a memory operably coupled to the processor and containing executable instructions, wherein execution of the instructions by the processor causes the transmitter apparatus to perform operations corresponding to the method of claim 12.

18. A receiver apparatus configured to detect and correct errors in received data, the apparatus comprising:
a processor; and
a memory operably coupled to the processor and containing executable instructions, wherein execution of the instructions by the processor causes the apparatus to:
receive data via a channel, wherein:
the data comprises a plurality of symbols formed into respective codewords having a same length of n symbols, where n>2;
each symbol corresponds to one of the following states: a ground state associated with a single photon, and one or more energized states associated with the single photon;
at least one of the symbols corresponds to the ground state; and
the only possible transitions in the channel are the one or more energized states transitioning to the ground state; and
analyze the plurality of symbols to determine whether a transition of any of the corresponding states has occurred; and
when it is determined that a transition of one or more of the states has occurred, detect or correct one or more errors in the data based on an error correction code having N>n valid codewords, wherein the N valid codewords include n length-n codewords with one symbol corresponding to the ground state and n−1 other symbols corresponding to any of the energized states.

19. The receiver apparatus of claim 18, wherein one or more of the following applies:
    the error correction code is capable of correcting for one photon loss per codeword; and
    n=3 and N=6.

20. The receiver apparatus of claim 18, wherein the N valid codewords also include at least one of the following:
    one or more first length-n codewords with n symbols corresponding to a same energized state; and
    a second length-n codewords with n symbols corresponding to the ground state.

* * * * *